(12) United States Patent
Ogawa et al.

(10) Patent No.: US 11,114,323 B2
(45) Date of Patent: Sep. 7, 2021

(54) VEHICLE

(71) Applicant: Daifuku Co., Ltd., Osaka (JP)

(72) Inventors: Daisuke Ogawa, Komaki (JP); Tsubasa Yajima, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 317 days.

(21) Appl. No.: 16/163,616

(22) Filed: Oct. 18, 2018

(65) Prior Publication Data

US 2019/0122910 A1    Apr. 25, 2019

(30) Foreign Application Priority Data

Oct. 23, 2017   (JP) .............................. JP2017-204664

(51) Int. Cl.
| | | |
|---|---|---|
| *B61L 23/00* | (2006.01) | |
| *H01L 21/67* | (2006.01) | |
| *G06K 9/00* | (2006.01) | |
| *H01L 21/677* | (2006.01) | |
| *B65G 43/00* | (2006.01) | |
| *B61L 25/00* | (2006.01) | |

(52) U.S. Cl.
CPC ........ *H01L 21/67265* (2013.01); *B61L 23/00* (2013.01); *B61L 25/00* (2013.01); *B65G 43/00* (2013.01); *G06K 9/00791* (2013.01); *H01L 21/6773* (2013.01); *H01L 21/67259* (2013.01); *H01L 21/67706* (2013.01); *H01L 21/67715* (2013.01); *H01L 21/67724* (2013.01); *H01L 21/67727* (2013.01); *H01L 21/67733* (2013.01); *B65G 2203/041* (2013.01)

(58) Field of Classification Search
CPC ........ B61L 23/00; B61L 23/04; B61L 23/042; B61L 23/045; B61L 23/047; B61L 25/00; B61L 25/02; B61L 25/021; B61L 25/06
See application file for complete search history.

(56) References Cited

U.S. PATENT DOCUMENTS

| | | | |
|---|---|---|---|
| 2011/0064273 A1* | 3/2011 | Zarembski ............... | B61K 9/08 382/104 |
| 2016/0332523 A1 | 11/2016 | Wada | |

FOREIGN PATENT DOCUMENTS

| | | | | |
|---|---|---|---|---|
| JP | 2008197705 A | * | 8/2008 | ............. B61B 13/06 |
| JP | 2008197705 A | | 8/2008 | |
| JP | 2016210371 A | | 12/2016 | |
| JP | 201733399 A | | 2/2017 | |
| JP | 2017033399 A | * | 2/2017 | ............... G05D 1/02 |

* cited by examiner

*Primary Examiner* — Robert J McCarry, Jr.
(74) *Attorney, Agent, or Firm* — The Webb Law Firm

(57) ABSTRACT

A vehicle includes one or more travel portions each configured to travel along a rail track, a travel controller configured to perform an image recognition to determine a shape of a portion of the rail track based on an image captured by an imaging device supported by the vehicle and to control the one or more travel portions based on a result of the image recognition, an information obtaining portion configured to obtain position information of each of a plurality of locations that the vehicle travels past as a result of traveling along the rail track, and to obtain the order in which the vehicle travels past such plurality of locations, and memory configured to store information obtained by the information obtaining portion.

8 Claims, 8 Drawing Sheets

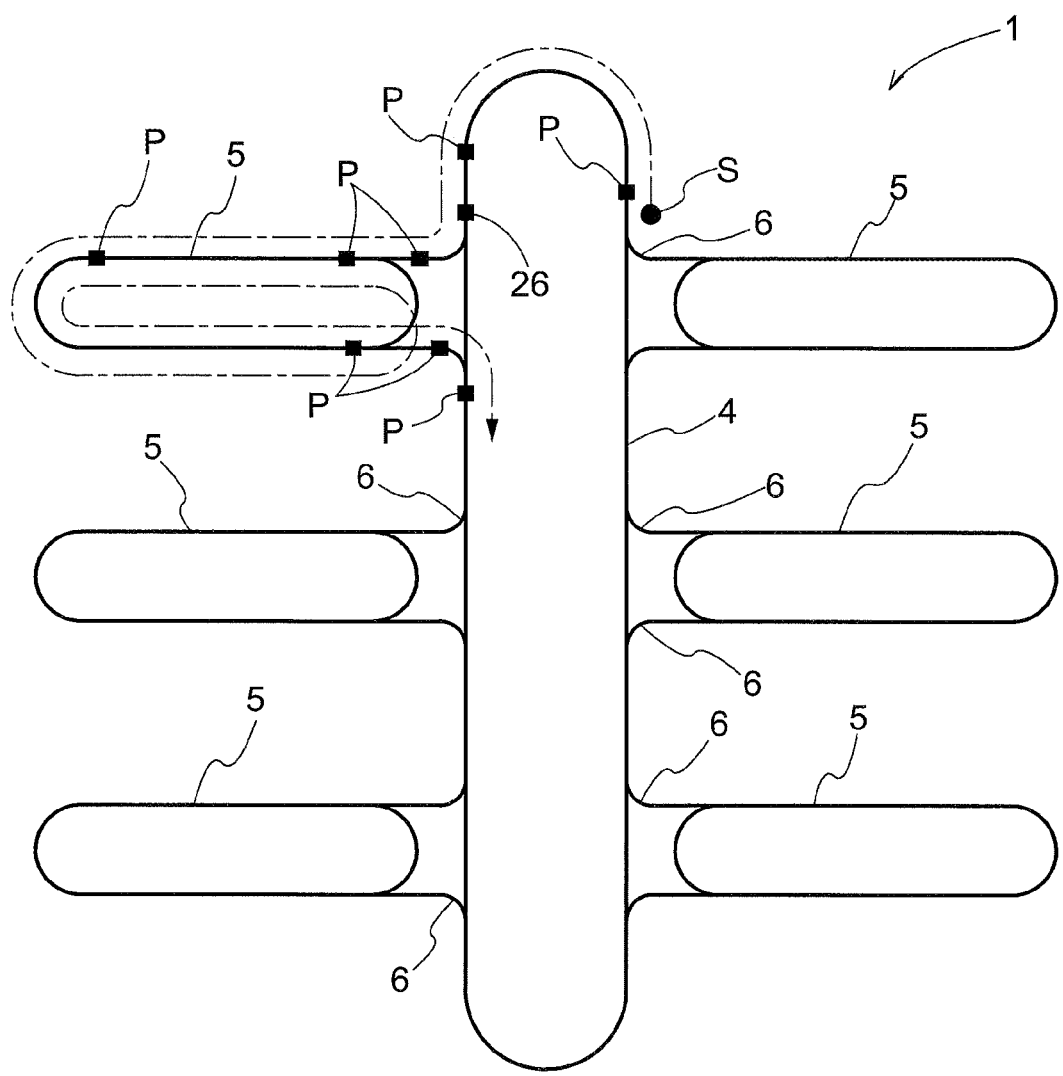

VEHICLE

CROSS-REFERENCE TO RELATED APPLICATION

This application claims priority to Japanese Patent Application No. 2017-204664 filed Oct. 23, 2017, the disclosure of which is hereby incorporated in its entirety by reference.

FIELD OF THE INVENTION

The present invention relates to a vehicle configured to travel along a rail track.

BACKGROUND

An example of such a vehicle is described in the JP Publication of Application No. 2016-210371 (Patent Document 1). The vehicle of Patent Document 1 has travel portions that travel along a rail track installed close to a ceiling.

SUMMARY OF THE INVENTION

The vehicle which travels close to the ceiling has a travel controller which controls travel portions and memory which stores information. In addition, the vehicle includes a position information reader which reads position information of a plurality of position displays that are spaced apart from each other along the rail track. The memory stores travel map information in which basic map information which is information that indicate the shapes of the rail tracks and how they are connected to one another is associated with position information of each position display device. The travel controller controls the travel portions such that the vehicle travels along the rail tracks based on information of the position displays read by the position information reader and on the travel map information.

Incidentally, with such a vehicle, it is necessary to prepare the travel map information in which the position information of each position display is associated with the basic map information and to store the travel map information in the memory, in advance. However, when the travel paths for the vehicles are long and there is a large amount of position information, the work required to create such travel map information had taken a substantial amount of time and efforts. And even after taking the time and efforts to prepare the travel map information, the travel map information needs to be prepared again when changes are made to the travel paths, again requiring a substantial amount of time and efforts.

Thus, a technology is desired which simplifies the work required to prepare travel map information in which position information is associated with basic map information.

In light of the above, a vehicle configured to support an imaging device and to travel along a rail track, the vehicle comprises: one or more travel portions each configured to travel along a rail track; a travel controller configured to perform an image recognition to determine a shape of a portion of the rail track based on an image captured by the imaging device and to control the one or more travel portions based on a result of the image recognition; an information obtaining portion configured to obtain position information of each of a plurality of locations that the one or more travel portions travel past as a result of traveling along the rail track, and to obtain the order in which the position information of the plurality of locations is obtained; and memory configured to store information obtained by the information obtaining portion.

With such an arrangement, since the travel controller can control the one or more travel portions by determining the shape of a portion of the rail track along which the vehicle travels based on the image recognition result, the travel controller can cause the one or more travel portions to travel along the rail track even if the travel controller does not have a complete travel map information. And while traveling in this manner, the position information of each of a plurality of locations along the rail track, and the order in which the position information of the plurality of locations is obtained can be obtained by the information obtaining portion. And such obtained information can be stored in the memory. And by using the information about the order in which the position information stored in the memory is obtained, the work required to associate the position information with the basic map information can be simplified. Therefore, the work required to create travel map information in which the position information is associated with the basic map information can be simplified.

BRIEF DESCRIPTION OF THE DRAWINGS

FIG. 9 shows the travel paths taken one after another by an article transport vehicle when performing a learning control.

DETAILED DESCRIPTION

1. Embodiment

An embodiment of an article transport facility including vehicles is described with reference to the attached drawings.

Figure 1:
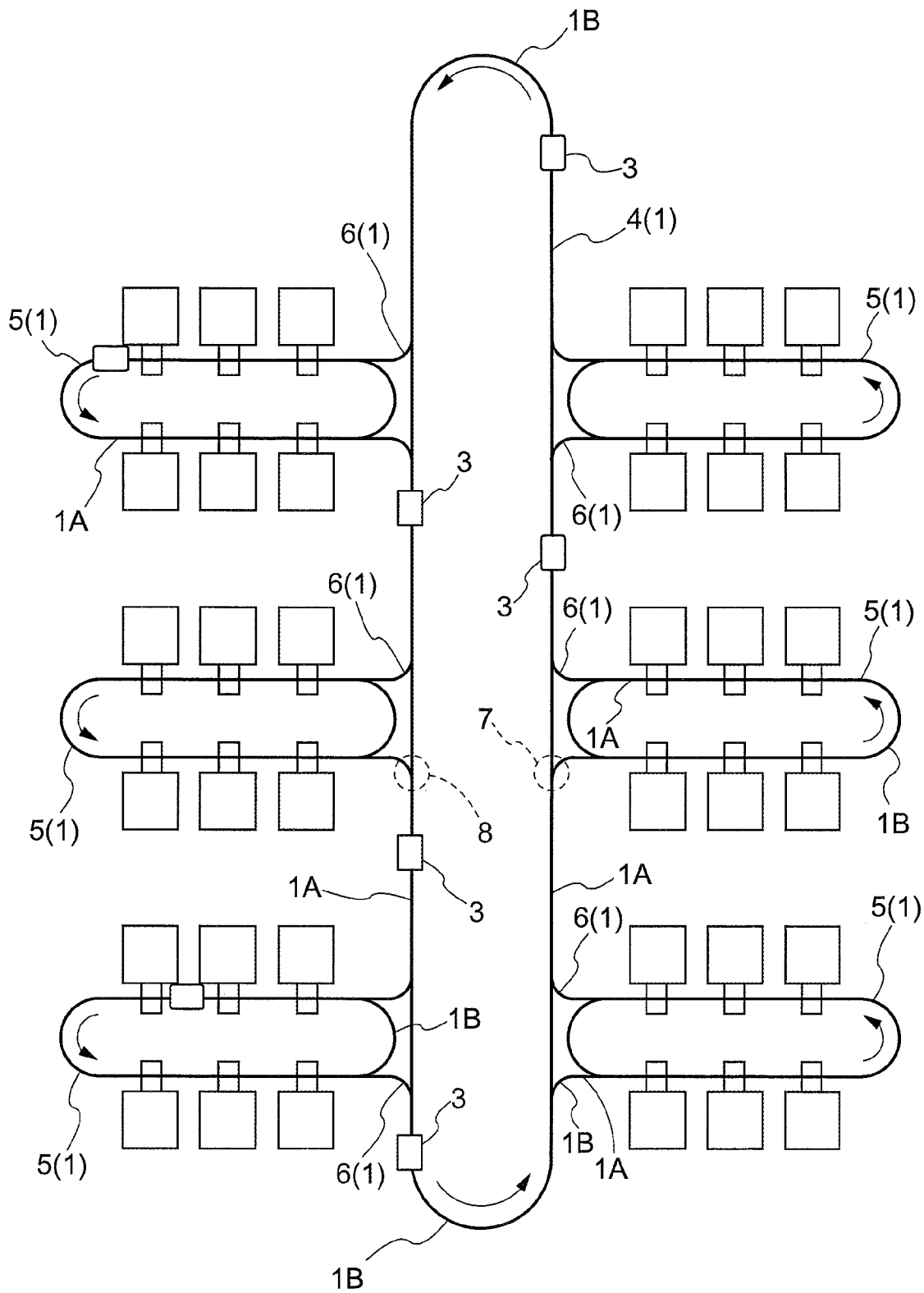
FIG. 1 is a plan view of an article transport facility.
Figure 2:
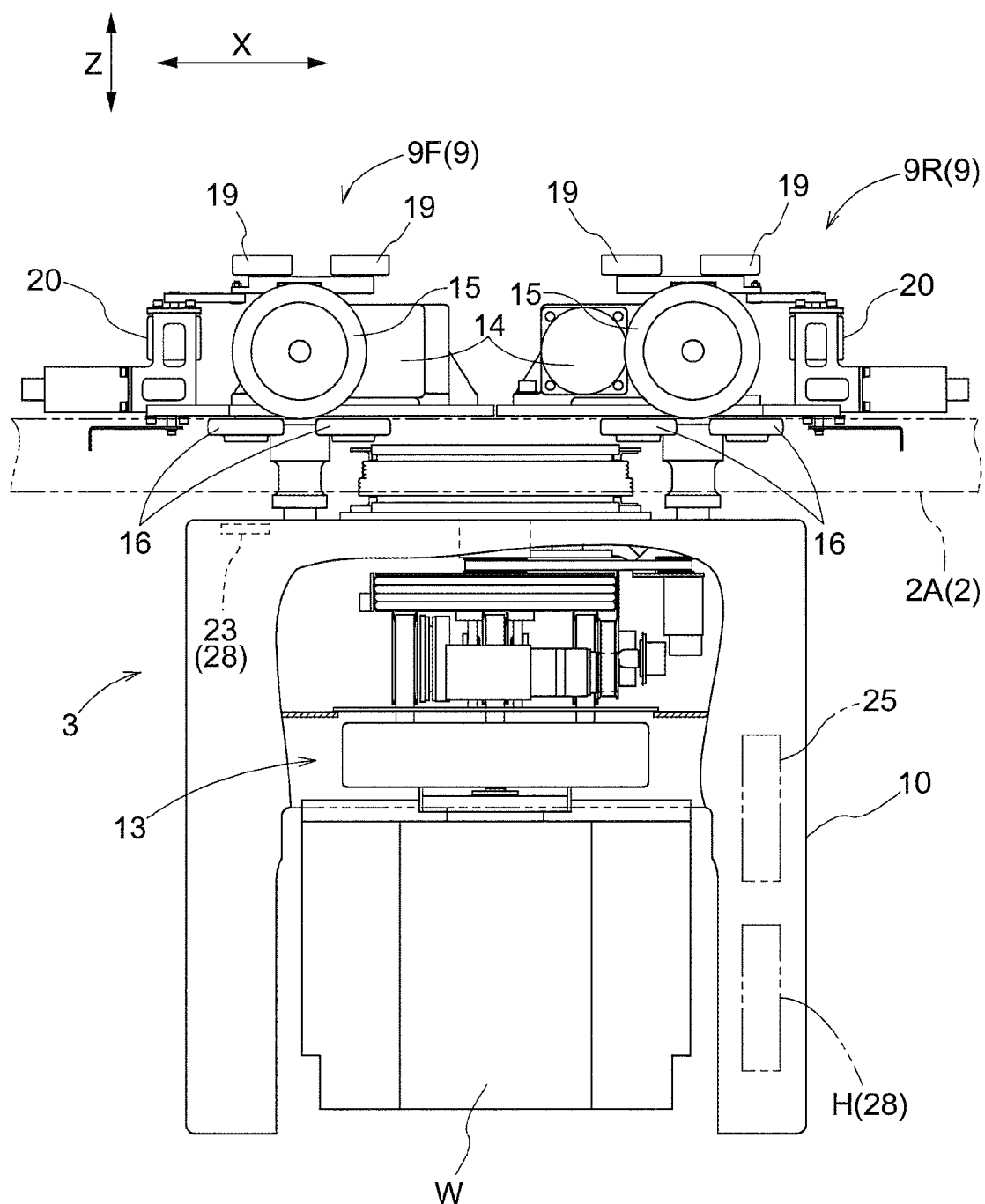
FIG. 2 is a side view of an article transport vehicle.
Figure 3:
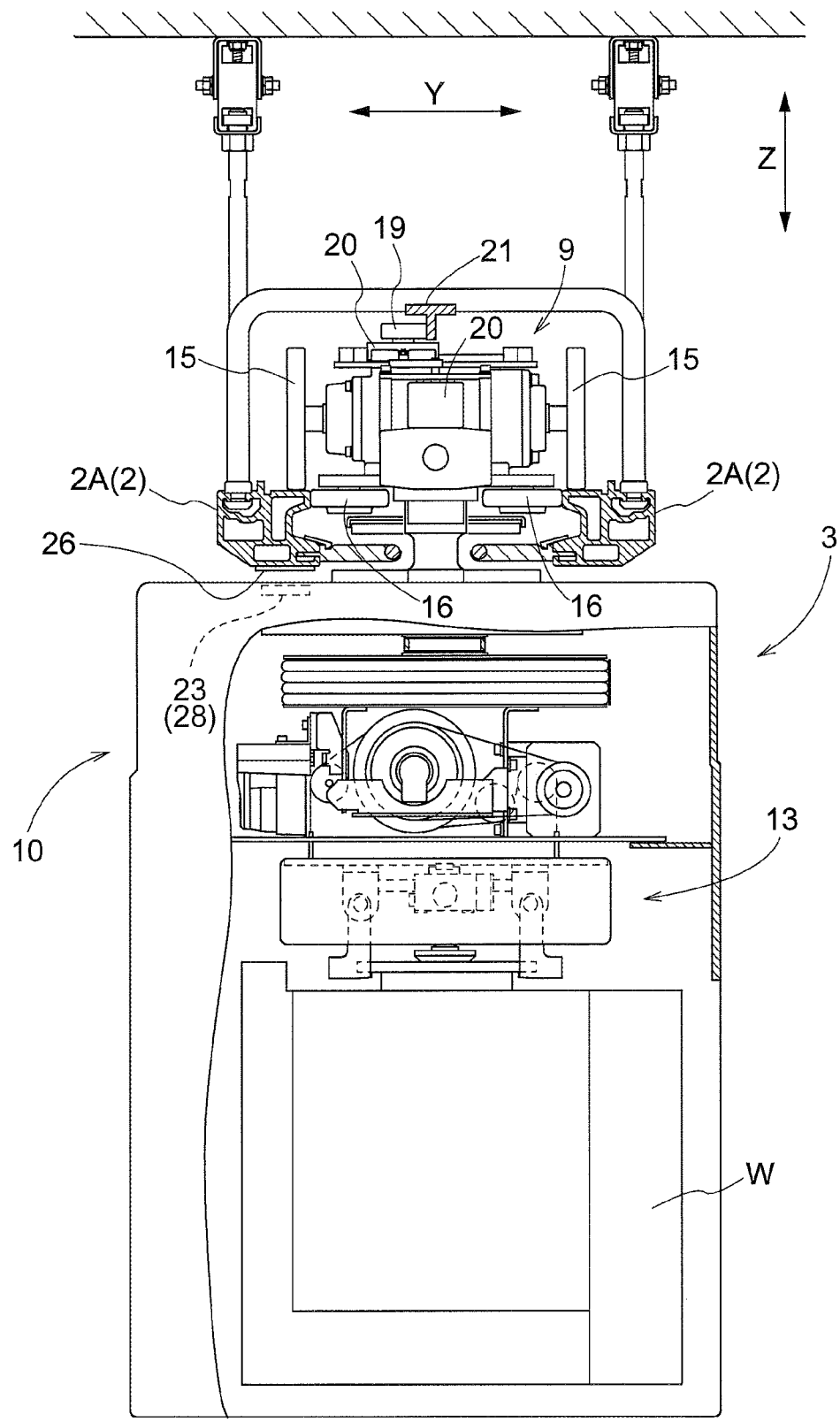
FIG. 3 is a front view of the article transport vehicle.

As shown in FIGS. 1 through 3, the article transport facility includes a travel rail track 2 installed along each travel path 1, and article transport vehicles 3 each configured to travel on and along a travel rail track 2 thus along the corresponding travel path 1. A travel rail track 2 (a "rail track" in claims) is formed by one or more rails. As shown in FIG. 3, each travel rail track 2 is formed by a pair of right and left rails 2A in the present embodiment. In the present embodiment, each article transport vehicle 3 is configured to transport, as an article W, a FOUP (Front Opening Unified Pod) for holding one or more semiconductor substrates. Note that a travel rail track 2 is, or corresponds to, a rail track while each article transport vehicle 3 is, or correspond to, a vehicle.

As shown in FIG. 1, the travel paths 1 include one primary path 4 which forms a closed loop, one or more secondary paths 5 each of which forms a closed loop and extends by way of a plurality of article processors, and one or more connecting paths 6 each of which connects the primary path 4 and a secondary path 5 to each other. The travel paths 1 include a plurality of secondary paths 5 and a plurality of connecting paths 6 in addition to one primary path 4, in the present embodiment. Each article transport vehicle 3 travels in one direction (counterclockwise in FIG. 1) in the primary path 4 and in each of the plurality of secondary paths 5, and thus travels in one direction along each travel path 1. Note that, in FIG. 1, the arrows indicate the travel directions of the article transport vehicles 3.

Each travel path 1 has a straight portion 1A which extends straight and at least one curved portion 1B which is curved. More specifically, the primary path 4 has a pair of straight portions 1A which extend parallel to each other, and a pair of curved portions 1B each of which connects corresponding end portions of the pair of the straight portions 1A. As with the primary path 4, each of the plurality of secondary paths 5 is formed to have a pair of straight portions 1A and a pair of curved portions 1B. Each connecting path 6 is formed to have a curved portion 1B connected to the primary path 4, and a straight portion 1A connected to a secondary path 5. Thus, each travel path 1 is formed by combining at least one straight portion 1A and at least one curved portion 1B.

An article transport vehicle 3 is described next.

As shown in FIGS. 2 and 3, each article transport vehicle 3 has travel portions 9 each configured to travel on and along a travel rail track 2 (i.e. along one or more travel rail tracks 2 one after another) which is suspended from and supported by a ceiling, and a main body portion 10 which is located below the travel rail track 2 and is suspended from, and supported by, the travel portions 9. Note that a horizontal direction that is perpendicular to the front-and-back direction X of an article transport vehicle 3 as seen along the vertical direction Z will be referred to as the lateral width direction Y. In addition, the right and left directions along, or parallel to, the lateral width direction Y are defined as those as seen from the back toward the front of the article transport vehicle 3.

The main body portion 10 includes a support portion 13 which is configured to suspend and support an article W and which is provided to the main body portion 10 such that it can be vertically moved or raised and lowered with respect to the main body portion 10.

Provided as the travel portions 9 are a first travel portion 9F and a second travel portion 9R which is spaced apart from the first travel portion 9F along the front-and-back direction X. Note that, of the pair of travel portions 9 that are spaced apart from each other along the front-and-back direction X, the travel portion 9 located in front along the front-and-back direction X will be referred to as the first travel portion 9F whereas the travel portion 9 located in the back along the front-and-back direction X will be referred to as the second travel portion 9R.

The first travel portion 9F has a first motor which is an electric motor 14 and a pair of right and left travel wheels 15 drivingly rotated by this first motor 14. The pair of right and left travel wheels 15 are provided to the first travel portion 9F such that the travel wheels 15 travel on corresponding top surfaces of the pair of right and left rails 2A which form a travel rail track 2. In addition, the first travel portion 9F has pairs of right and left guide wheels 16 with each guide wheel 16 being freely rotatable about an axis extending along a vehicle body vertical direction (i.e., about a vertical axis). The first travel portion 9F has two pairs of right and left guide wheels 16 with one pair spaced apart from the other pair along the front-and-back direction X.

As with the first travel portion 9F, the second travel portion 9R has a first motor 14, a pair of right and left travel wheels 15, and two pairs of right and left guide wheels 16.

As shown in FIGS. 2 and 3, the first travel portion 9F further has pairs of front and back guide auxiliary wheels 19 with each guide auxiliary wheel 19 being rotatable about a vertical axis (axis along the vertical direction Z) at a location higher than the travel wheels 15, and a second motor 20 which is an electric motor used to move the guide auxiliary wheels 19 along the lateral width direction Y. The second motor 20 is connected to an arm whose end is pivotably connected to a platform that supports the guide auxiliary wheels 19 through respective pivot shafts, with the platform being slidable, or otherwise movable, on a pair of rails that extend along the lateral width direction Y. The first travel portion 9F has two guide auxiliary wheels 19 with one spaced apart from the other along the front-and-back direction X.

As with the first travel portion 9F, the second travel portion 9R has two guide auxiliary wheels 19 with one spaced apart from the other along the front-and-back direction X.

Figure 4:
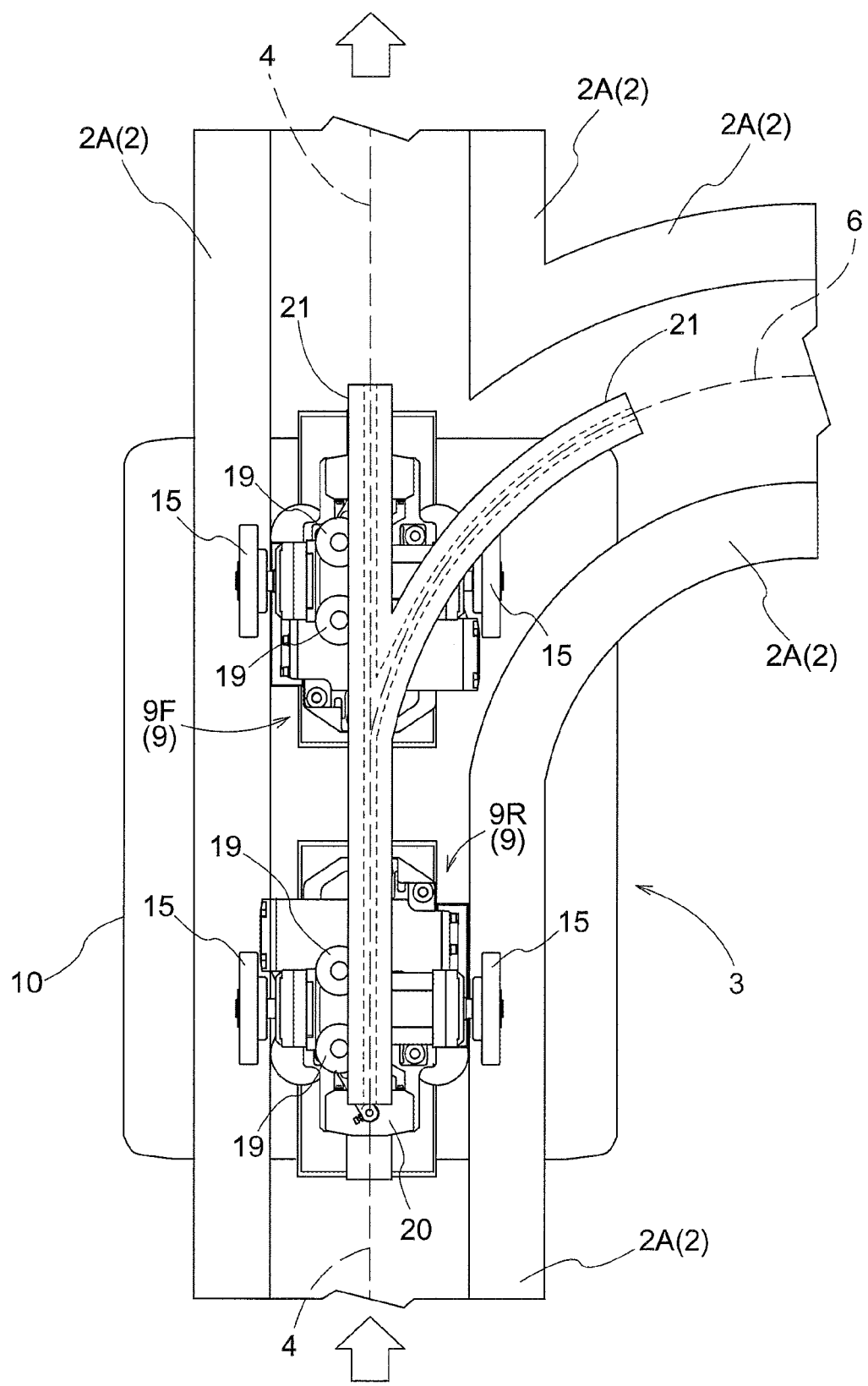
FIG. 4 is a plan view of a branching location.
Figure 5:
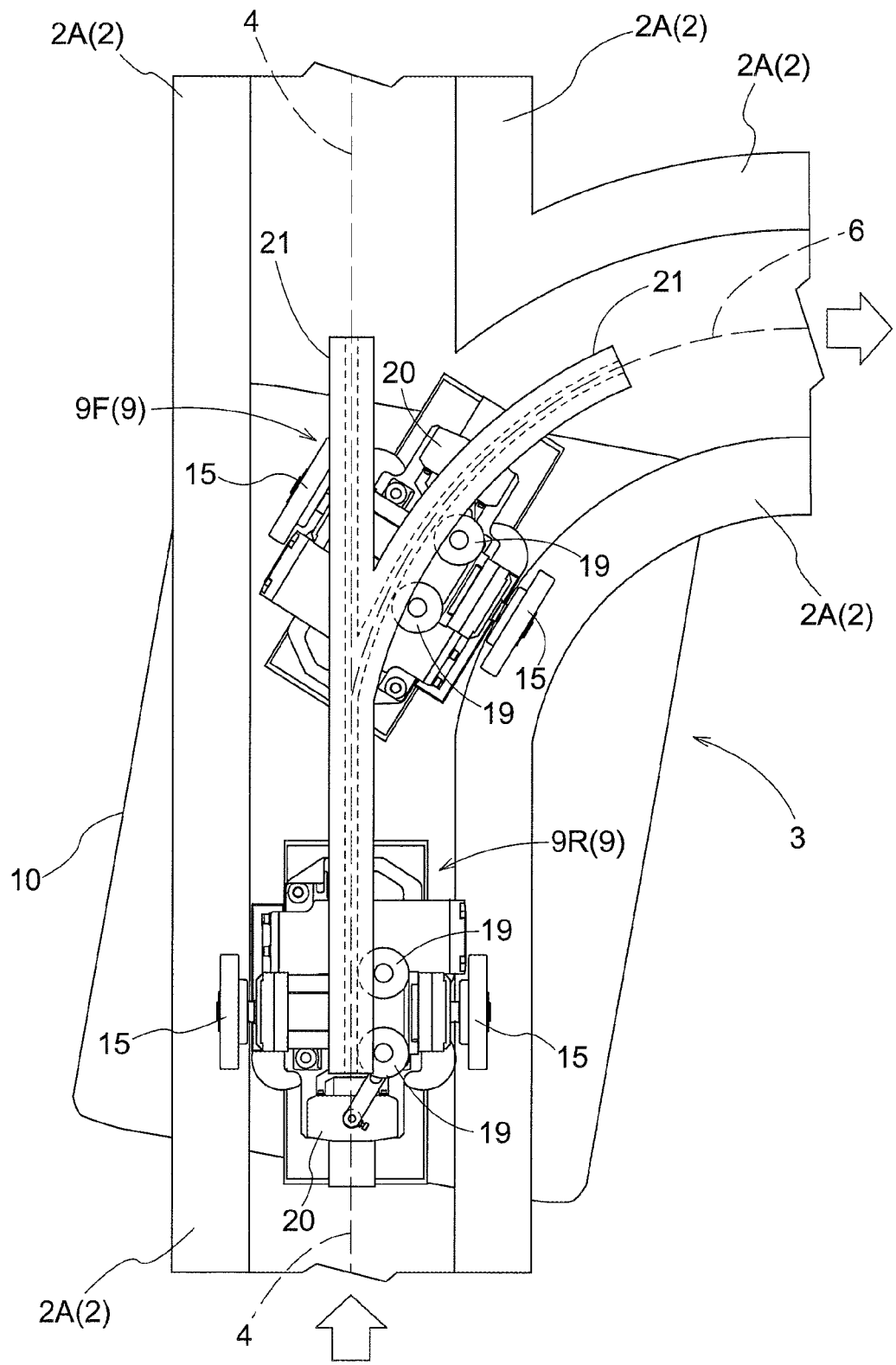
FIG. 5 is a plan view of the branching location.

As shown in FIGS. 4 and 5, the first travel portion 9F is configured to move the pair of front and back guide auxiliary wheels 19 to a right guiding position (see FIG. 5) and a left guiding position (see FIG. 4) by moving the guide auxiliary wheels 19 along the lateral width direction Y using the second motor 20. The right guiding position is a position at which the pair of front and back guide auxiliary wheels 19 are located to the right of the center, along the lateral width direction Y, of the first travel portion 9F and contact a guide rail 21 from the right-hand side. The left guiding position is a position at which the pair of front and back guide auxiliary wheels 19 are located to the left of the center, along the lateral width direction Y, of the first travel portion 9F and contact the guide rail 21 from the left-hand side.

As with the first travel portion 9F, the second travel portion 9R is configured to move the pair of front and back guide auxiliary wheels 19 to a right guiding position and a left guiding position by using its second motor 20.

As shown in FIGS. 1, 4, and 5, in a branching portion 7 in which a travel rail track 2 branches off from another travel rail track 2, there are two possible travel directions (i.e. two possible travel rail tracks 2 or travel paths 1) for an article transport vehicle 3 to take; thus, the article transport vehicle 3 needs to select one travel direction (i.e. one travel rail track 2 or travel path 1) from a plurality of travel directions. The article transport vehicle 3 selects and take the travel direction by moving the position of the guide auxiliary wheels 19 to either the right guiding position or the left guiding position. Note that, in FIG. 1, the reference numeral "7" is shown only for one of the plurality of branching portions 7 provided in the facility.

A situation in which an article transport vehicle 3 travels through a branching portion 7 of the primary path 4 as shown in FIGS. 4 and 5 is described as an example of how an article transport vehicle 3 travels through a branching portion 7. As possible travel directions for each branching portion 7 in the present embodiment, there are a straight forward travel direction along which the article transport vehicle 3 continues to travel along the primary path 4 when taken, a branching direction (i.e., direction that corresponds to a travel rail track 2 that branches off) along which the article transport vehicle 3 changes its path to a connecting path 6 from the primary path 4 when taken. In the example shown in the drawings, as seen in the travel direction, the straight forward travel direction is one that appears to point directly ahead, and the branching direction appears to point to the right.

When the straight forward travel direction is selected as the travel direction to take at a branching portion 7, an article transport vehicle 3 enters the branching portion 7 with the guide auxiliary wheels 19 moved to the left guiding position as shown in FIG. 4. This causes the guide auxiliary wheels 19 to travel while located on the left-hand side of the guide rail 21. Thus, the article transport vehicle 3 travels through the branching portion 7 in the straight forward travel direction with the guide auxiliary wheels 19 being guided by the guide rail 21.

When the branching direction (or the travel rail track 2 or travel path 1 that branches off from the primary path 4) is selected as the travel direction to take at the branching portion 7, the article transport vehicle 3 enters the branching portion 7 with the guide auxiliary wheels 19 moved to the right guiding position as shown in FIG. 5. This causes the guide auxiliary wheels 19 to travel while located on the right-hand side of the guide rail 21. Thus, the article transport vehicle 3 travels through the branching portion 7 selecting the branching direction with the guide auxiliary wheels 19 being guided by the guide rail 21.

Figure 6:
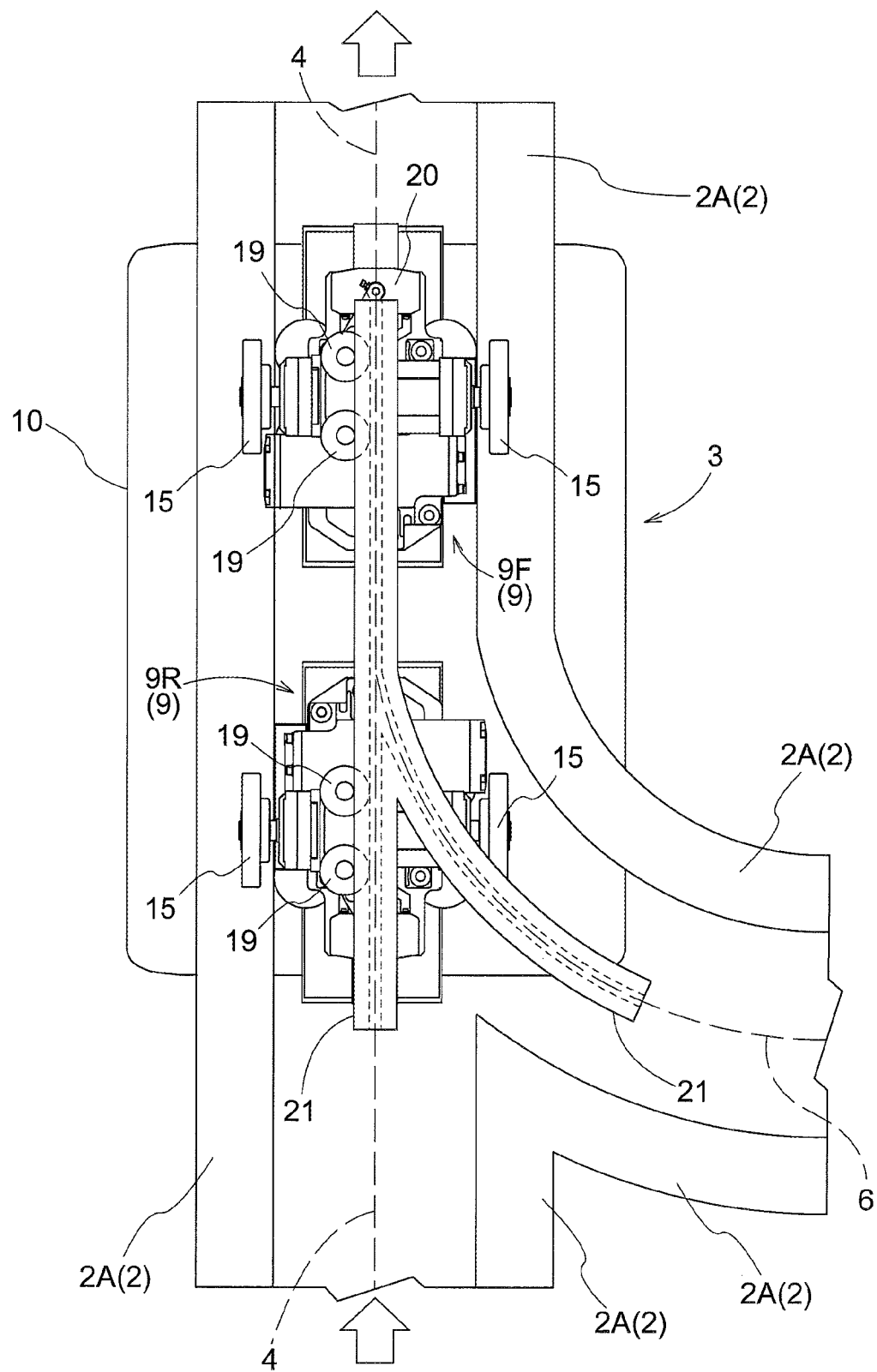
FIG. 6 is a plan view of a merging portion.

As shown in FIGS. 1 and 6, a travel rail track 2 merges with another travel rail track in a merging portion 8. Note that, in FIG. 1, the reference numeral "8" is shown only for one of the plurality of merging portions 8 provided in the facility.

A situation in which an article transport vehicle 3 travels through a merging portion 8 of the primary path 4 as shown in FIG. 6 is described as an example of how an article transport vehicle 3 travels through a merging portion 8. In this merging portion 8, a connecting path 6 merges from the right-hand side of the primary path 4 as seen from an article transport vehicle 3 traveling along the primary path 4 in the travel direction and before reaching the merging portion 8. When passing through a merging portion 8 in which another travel path merges, from the right-hand side, with the travel path 4 along which the article transport vehicle 3 is traveling, the article transport vehicle 3 enters the merging portion 8 with the guide auxiliary wheels 19 moved to the left guiding position. This causes the guide auxiliary wheels 19 to travel while located on the left-hand side of the guide rail 21.

Incidentally, while not shown, when passing through a merging portion 8 in which another travel path merges, from the left-hand side, with the travel path 4 along which the article transport vehicle 3 is traveling, the article transport vehicle 3 enters the merging portion 8 with the guide auxiliary wheels 19 moved to the right guiding position to cause the guide auxiliary wheels 19 to travel while located on the right-hand side of the guide rail 21.

Figure 7:
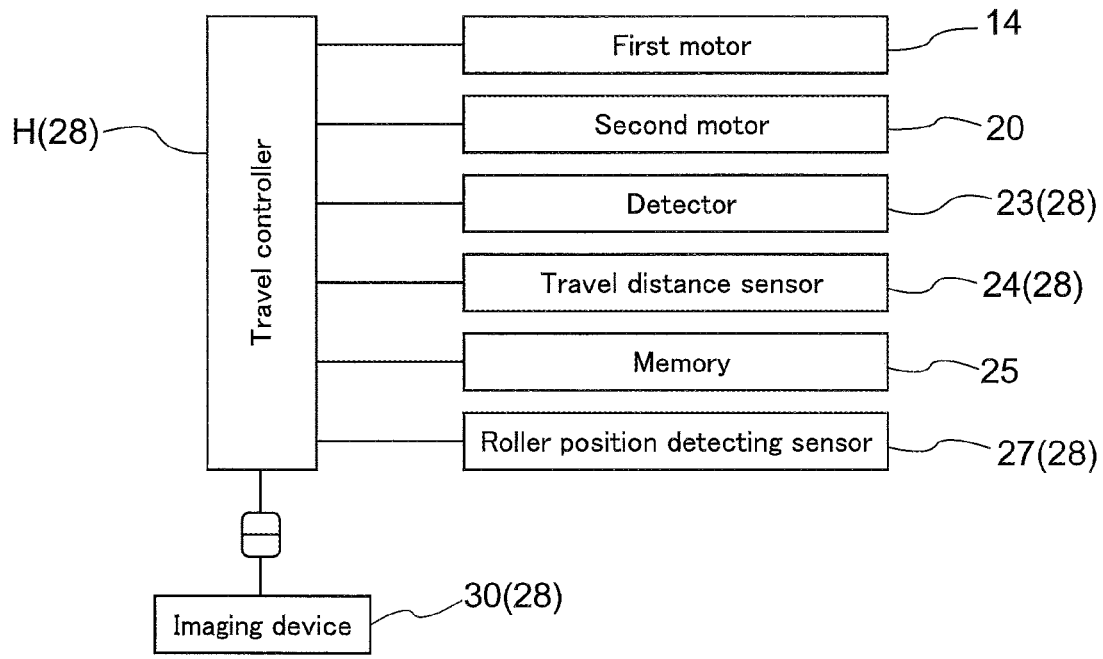
FIG. 7 is a control block diagram.

As shown in FIG. 7, each article transport vehicle 3 includes a detector 23 (see FIGS. 2 and 3), a travel distance sensor 24, a roller position detecting sensor 27, memory 25 (see FIG. 2), and a travel controller H (see FIG. 2). Each controller, such as the travel controller H, includes a CPU and peripheral circuitry such as memory circuitry and circuitry for communicating with one or more of various components such as motors or actuators, sensors, other controller(s) and may be a microcomputer, with algorithms in the form of software that is stored in the memory circuitry and executable by the CPU for performing the required functions disclosed in the present specification. The memory circuitry of the travel controller H may perform as the memory 25. The memory 25 may be a separate entity from, and electrically connected to, the travel controller H. The memory 25 may be a combination of the two. The detector 23 reads position information indicated by detected members 26 provided at locations that are spaced apart from one another along each travel rail track 2. In the present embodiment, each detected member 26 provides position information, which is information about the position or location of the detected member 26, in the form of a barcode. The detector 23 is a bar code reader which reads a barcode displayed on a detected member 26. The travel distance sensor 24 includes a rotary encoder, and measures a distance (travel distance) travelled by the article transport vehicle 3. For example, the travel distance sensor 24 may be an optical sensor that measures the number of rotations of a travel wheel 15. The roller position detecting sensor 27 detects the position of the guide auxiliary wheels 19, and may be an angle sensor coupled to the arm to which a second motor 20 is connected, or may be an optical sensor or a rotary encoder so positioned to measure the rotation of the second motor 20. Note that, in the present embodiment, a detected member 26 is, or corresponds to, a position display whereas the detector 23 is, or corresponds to, a position information reader configured to read position information of position displays.

As shown in FIG. 3, each detected member 26 is installed at such a position and so oriented that it can be detected and read by the detector 23 of an article transport vehicle 3 traveling along the travel path 1. In the present embodiment, a plurality of detected members 26 are attached to, and thus installed on, the bottom surface of one of the rails 2A of each travel rail track 2 along each travel path 1. And the detected members 26 are provided at such locations as, for example, a location upstream of, and spaced apart from, the upstream end of each branching portion 7 by a set distance (such location is referred to as the entrance of the branching portion 7), a location downstream of, and spaced apart from, each downstream end of each branching portion 7 by a set distance (such location is referred to as the exit of the branching portion 7), a location upstream of, and spaced apart from, an upstream end of each curved portion 1B by a set distance (such location is referred to as the entrance of the curved portion 1B), and a location downstream of, and spaced apart from, the downstream end of each curved portion 1B by a set distance (such location is referred to as the exit of the curved portion 7), among other possible locations.

The travel paths 1 are imaginary paths along which the article transport vehicles 3 are expected to travel. Travel map information is stored in the memory 25. The travel map information is information in which basic map information which includes information about the shape of each travel path 1 (travel rail track 2) and about how the travel paths 1 (travel rail tracks 2) are connected to one another is associated with various information needed for the traveling of the article transport vehicles 3 such as position information of a plurality of locations along each travel path 1. Information about the shape of each travel path 1 (travel rail track 2) preferably includes information about the shape of each portion of each travel path 1. Information about how the travel paths 1 (travel rail tracks 2) are connected to one another includes at least information about which travel path 1 (and the corresponding travel rail track 2) is connected to which other travel path 1 and more preferably includes information about which portion of a travel path 1 is connected to which other portion(s) of the travel path 1 for each of the travel paths 1. The travel controller H performs a planning control and a transport control when it receives a transport command from a superordinate controller (not shown). A planning control is a control in which one or more paths are selected that should be taken in order to transport an article W from a transport origin (location from which the article is transported) to a transport destination (location to which the article is transported) as specified by a transport command, based on the travel map information stored in the memory 25. A transport control is a control performed to cause the article transport vehicle 3 to travel along the path or paths selected in advance by the planning control to transport an article W from a transport origin to a transport destination.

If the travel portions 9 are traveling along the travel rail track 2 as a result of a transport control being performed, the travel controller H determines the current position of the travel portions 9 based on the travel map information, information received from the detector 23, and information received from the travel distance sensor 24.

In addition, if the detector 23 detects a detected member 26 located at the entrance of a branching portion 7, the travel controller H controls the second motor 20 to change the position of the guide auxiliary wheels 19 to either the right guiding position or the left guiding position to select the travel direction (or the travel rail track 2 or travel path 1) for the travel portions 9 to take in the branching portion 7 so that the selected travel direction is appropriate for reaching the location of the transport origin or the transport destination for an article W.

Thus, the travel controller H moves the guide auxiliary wheels 19 to the position that corresponds to the travel direction selected for the branching portion 7. Note that, in the present embodiment, the guide auxiliary wheels 19 are, or correspond to, guide rollers configured to guide one of more travel portions 9 in the selected travel direction when traveling through a branching portion 7.

In addition, the travel speed information that indicates the travel speed (the set travel speed) set in advance for the travel portions 9 is stored in the memory 25 such that the travel speed information is associated with the position information. It is preferable that the set travel speed varies depending on, for example, the shape of the rail track, among other possibilities. For example, the set travel speed may be set such that the greater the curvature of the rail track is, the lower the set travel speed is. In the present embodiment, depending on whether a given portion of a rail track is curved or straight, the set travel speed for a curved portion is set to be lower than the set travel speed for a straight portion. Therefore, if the detector 23 detects a detected member 26 located at the entrance of a curved portion 1B while a transport control is being performed, the travel controller H controls the first motor 14 such that the travel speed of the article transport vehicle 3 matches a first travel speed. And if the detector 23 detects a detected member 26 located at an exit of a curved portion 1B while a transport control is being performed, the travel controller H controls the first motor 14 such that the travel speed of the article transport vehicle 3 matches a second travel speed. Here, the first travel speed is the travel speed set for traveling along a curved portion 1B whereas the second travel speed is the travel speed set for traveling along a straight portion 1A. The first travel speed is set to be lower than the second travel speed.

In this manner, the travel controller H controls the travel portions 9, based on the travel speed information which is associated with the position information of each detected member 26, to cause the travel portions 9 to travel at the relatively high second travel speed when the travel portions 9 travels along a straight portion 1A and to cause the travel portions 9 to travel at the first travel speed when the travel portions 9 travels along a straight portion 1A.

If, for example, travel map information has not yet been prepared, the travel controller H can perform a learning control for collecting information necessary to prepare or create a new travel map information. Examples of a situation where travel map information has not yet been prepared include when the article transport facility has just been newly installed and when the travel paths have been altered, for example, due to changes made in the layout of the article transport facility that has already been in existence. When the travel controller H of an article transport vehicle 3 performs the learning control, an imaging device 30 is mounted to and supported by the article transport vehicle 3, and basic map information is stored in the memory 25. In other words, before starting the learning control, the basic map information has already been stored in the memory 25. Here, although the basic map information includes information about the shapes of the travel paths 1 or the travel rail tracks 2 as well as how they are connected to one another, it does not include position information or travel speed information described above. In addition, in the present embodiment, the memory 25 is, or corresponds to, the map memory with basic map information stored therein.

Figure 8:
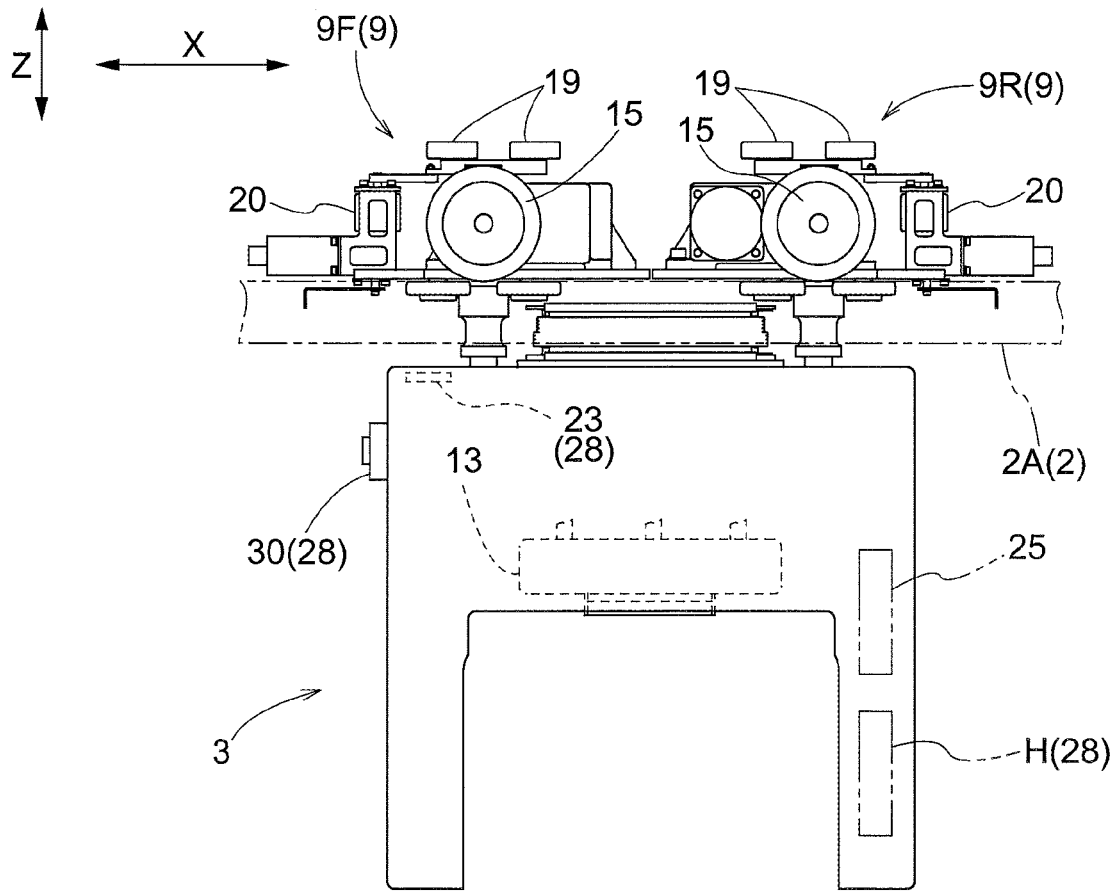
FIG. 8 is a side view of the article transport vehicle supporting an imaging device.

The imaging device 30 is configured to be removably mounted to and thus supported by an article transport vehicle 3 using any conventional method used to mount an object to another object. Examples of such method include ones that make use of one or a combination of: (1) one or more removable fasteners such as screws or bolts; (2) one or more magnets; and (3) one or both of (i) one or more mounting brackets or braces formed, fixed or fixable to one of the article transport vehicle 3 and the imaging device 30 and (ii) a structure (such as a hook or any other suitable member or members) that is formed, fixed, or fixable to the other of the article transport vehicle 3 and the imaging device 30 and that cooperates with the mounting bracket or brace. When the travel controller H performs the learning control, the imaging device 30 is mounted to, and supported by, the article transport vehicle 3 as shown in FIG. 8. And when the travel controller H does not perform the learning control, the imaging device 30 is removed from the article transport vehicle 3 as shown in FIG. 2. In the present embodiment, the imaging device 30 is attached, mounted to, and supported by the front face of the main body portion 10 so as to capture an image of any parts or portions located ahead of the article transport vehicle 3. In addition, the imaging device 30 is preferably a stereoscopic digital camera, which then enables the imaging device 30 to not only capture the scenery that includes any parts or portions of the facility that are located ahead but also the detect distances to such parts or portions.

As shown in FIG. 7, the article transport vehicle 3 includes an information obtaining portion 28. This information obtaining portion 28 obtains position information of each of the detected members 26 that has been read by the detector 23, and connection information which indicates how a plurality of detected members 26 are connected by the travel rail tracks 2 (i.e., the identity of the travel rail track 2 which each of the plurality of detected members 26 is attached to or otherwise associated with as well as the order of the locations of the detected members along each such travel rail track 2). And the information obtaining portion 28 stores in the memory 25 the obtained position information and the connection information such that the position information and the connection information are associated with the basic map information.

The detector 23 is, or corresponds to, the position information reader configured to read position information of a plurality of detected members 26 that are spaced apart from one another along each travel rail track 2. And the information obtaining portion 28 includes the detector 23 and is configured to obtain position information of each of a plurality of locations that the article transport vehicle 3 travel past as a result of the article transport vehicle 3 traveling along a travel rail track 2, as well as the order in which the position information of the plurality of locations is obtained. In addition, based on the order in which the position information of the plurality of detected members 26 is obtained and the identity of the travel path along which the travel portions 9 traveled as each position information is obtained, the information obtaining portion 28 obtains connection information, which indicates how the plurality of detected members 26 are connected to one another by the travel rail tracks 2. Further, in addition to the detector 23, the information obtaining portion 28 includes the travel distance sensor 24 which obtains distance information (which indicates the distance travelled by the article transport vehicle 3), the roller position detecting sensor 27 which obtains roller information (which indicates the position of the guide auxiliary wheels 19), the imaging device 30 which can be used to obtain speed information, and the travel controller H which causes the memory 25 to store position information and connection information such that the position information and the connection information are associated with the basic map information.

The learning control is described next.

In the learning control, the travel portions 9 are caused to travel along travel rail tracks 2 (i.e., along one travel rail track after another). During that time, the travel controller H controls the travel portions 9 to cause them to travel basically at the first travel speed set for traveling along a curved portion 1B. While the learning control is being performed, the travel controller H determines the current position of the travel portions 9 based on the basic map information, the roller information which indicates the position of the guide auxiliary wheels 19 in a branching portion 7, and detected information from the travel distance sensor 24.

In the learning control, the travel controller H determines or recognizes the shape of a portion of the travel rail track 2 based on the image information captured by the imaging device 30 and controls the travel portions 9 based on the result of the image recognition.

To describe this further, the travel controller H determines, based on the result of the image recognition, whether a branching portion 7 is present in which a travel rail track 2 branches off from another travel rail track 2 as well as the configuration of the branching portion 7 if present, and selects the travel direction to be taken at each branching portion 7. In the present embodiment, the determination of the configuration of a branching portion 7 includes determining which one of the travel rail tracks 2 (to be selected from) extends straight forward and which one is curved, and thus determining which one of the travel rail tracks 2 branches off from the travel rail track 2 that extends straight forward in the branching portion. When the travel controller H selects the travel direction, the travel controller H makes the selection such that the travel rail track 2 that the travel portions 9 have not travelled along is preferentially selected if there is a travel rail track 2 the travel portions 9 have not travelled along exists among a plurality of possible travel rail tracks 2 that can be taken at a branching portion 7. And the travel controller H controls the travel portions 9 to cause them to take the selected travel direction. In addition, if the travel portions 9 have not travelled along either the travel rail track 2 that extends straight forward (in the straight forward travel direction) or the travel rail track 2 that extends in a branching direction (i.e. that branches off from the travel rail track 2 that extends straight forward) at a branching portion 7, or if the travel portions 9 have travelled along both of these travel rail tracks 2 at a branching portion 7, then the travel controller H selects one of the travel rail tracks 2 based on a predetermined priority value. In the present embodiment, a higher priority value is set for the travel rail track 2 that branches off than the travel rail track 2 that extends in the straight forward travel direction.

In the learning control, the travel portions 9 are caused to travel along the travel rail tracks 2 (i.e. along one travel rail track 2 after another); and, the position information indicated by the detected member 26 located at each of a plurality of locations which the travel portions 9 travel past is read by the detector 23. In such a manner, the position information of each of a plurality of locations and the order in which the position information of the plurality of locations is obtained by sequentially reading a plurality of pieces of position information provided at locations that are spaced apart from one another along the travel rail tracks 2, using the detector 23. Also, when looking at this in terms of travel paths 1 along travel rail tracks 2, the detected members 26 that provided the position information obtained in sequence is connected by one or more travel rail tracks 2. Thus, in the learning control, the connection information which indicates how a plurality of detected members 26 are connected by one or more travel rail tracks 2 is obtained by obtaining the position information of each of a plurality of detected members 26 and the order in which the position information of the plurality of detected members 26 is obtained by causing the travel portions 9 to travel along the one or more travel rail tracks 2 (i.e., one after another), and by referencing or using information about (identifying information of) the travel paths along which the travel portions 9 have traveled (i.e., information about the travel direction taken at each branching portion 7 through which the travel portions 9 have travelled).

And the position information of each location (or a detected member 26) read by means of the detector 23 is stored in the memory 25 such that the position information is associated with a location in the basic map information, more specifically, a location in the basic map information that corresponds to the location of the travel portions 9 at the time the position information of that location (detected member 26) is read. Thus, when functioning as the information obtaining portion 28, the travel controller H stores in the memory 25 the position information of each of a plurality of locations (detected members 26) such that the position information of each of a plurality of locations is associated with the basic map information.

In addition, in the learning control, distance information, speed information, and roller information are also obtained when position information of each location is read by the detector 23. And the travel controller H stores in the memory 25 the distance information, the speed information, and the roller information such that each of the distance information, the speed information, and the roller information is associated with the position information.

The distance information includes information which indicates the travel distance travelled by the travel portions 9 while traveling from a location at which the position information of a detected member 26 is read to a location at which the position information of the next detected member 26 located downstream is read (i.e., the distance between any two adjacent detected members 26 that the travel portions 9 travel past). The travel controller H obtains the distance information based on information obtained by the detector 23 and information obtained by the travel distance sensor 24.

The speed information indicates the set travel speed for the travel portions 9 at the location of each detected member 26 from which position information is read. In the present embodiment, the travel controller H obtains information about a proper set travel speed based on an image recognition result. More specifically, the travel controller H determines the proper travel speed depending on the shape of the travel rail track 2 (for example, depending on the curvature of the travel rail track 2, among other possibilities) based on an image recognition result. That is, when the travel rail track 2 is curved, it is desirable to set the travel speed relatively low to allow the travel portions 9 to maintain stability during the traveling. In that case, it is desirable to set the travel speed such that the greater the curvature of the travel rail track 2 is, the lower the travel speed is. In contrast, when the travel rail track 2 extends straight or has a small curvature even if it is curved, the travel speed can be set to be relatively high. In the present example, the travel controller H selects the first travel speed as the set travel speed if the travel controller H determines based on an image recognition result that the travel rail track 2 located ahead is curved whereas the travel controller H selects the second travel speed as the set travel speed if the travel controller H determines based on an image recognition result that the travel rail track 2 located ahead extends straight.

The roller information includes information that indicates the position of the guide auxiliary wheels 19 when the travel portions 9 travel past each detected member 26. The travel controller H obtains roller information based on information obtained by the roller position detecting sensor 27. The travel direction taken by the travel portions 9 at a branching portion 7 can be learned based on this roller information.

In FIG. 9, the starting location S denotes the location at which an article transport vehicle 3 starts traveling whereas the reading locations P are the locations of the detected members 26. When the travel controller H performs the learning control, the article transport vehicle 3 travels from the starting location S and travels along as shown by the broken line (a line with a dash) with an arrow at its end indicating the direction of travel. And the information obtaining portion 28 obtains position information at each of the plurality of reading locations P and obtains information about the order in which the position information of the reading locations P is obtained. The travel controller H stores the obtained position information in the memory 25 such that the position information is associated with the basic map information. Further, in the present embodiment, in addition to the position information and connection information, the information obtaining portion 28 obtains distance information which indicates a distance between two adjacent detected members 26, speed information which indicates the set travel speed for the travel portions 9 which is set for each of a plurality of detected members 26, and roller information which indicates the position of the guide auxiliary wheels 19 of a travel portion 9 at the time of traveling past each of a plurality of detected members 26. And the travel controller H stores in the memory 25 the distance information, the speed information, and the roller information that were obtained such that the distance information, the speed information, and the roller information are associated with the position information.

2. Other Embodiments

Other embodiments of the vehicle are described next.

(1) In the embodiment described above, an example is described in which, when performing the learning control, the basic map information is stored in the memory 25, and the obtained position information and the connection information is stored in the memory 25 such that the position information and the connection information are associated with the basic map information. However, the invention is not limited to such an arrangement. The learning control may be performed without storing the basic map information in the memory 25. In this case, the position information and the connection information that are obtained by the information obtaining portion 2 may be stored in the memory 25 in a format defined in advance.

(2) In the embodiment described above, an example is described in which the travel direction to take at a branching portion 7 is selected such that the travel rail track 2 that the travel portions 9 have not travelled along is preferentially selected among a plurality of possible travel rail tracks 2 that can be taken at the branching portion 7. However, the way in which the travel direction for the travel portions 9 to take at a branching portion 7 is selected may be changed as desired. For example, the travel direction to take at a branching portion 7 may be selected by randomly selecting one among a plurality of possible travel rail tracks 2 that can be taken at the branching portion 7.

(3) In the embodiment described above, an example is described in which the position information of each of a plurality of locations and the order, in which the position information of the plurality of locations is obtained, are obtained by reading the position information provided by a plurality of detected members 26 that are spaced apart from one another along the travel rail tracks 2 by means of the detector 23. The method to obtain the position information is not limited to such an arrangement. For example, the information obtaining portion 28 may be so configured to obtain the position information of each of a plurality of locations and the order in which the position information of the plurality of locations is obtained, by obtaining information transmitted from the GPS Satellites, or other source(s) of such information.

(4) In the embodiment described above, an example is described in which the travel direction of the travel portions 9 at a branching portion 7 is controlled or selected by providing guide auxiliary wheels 19 and by moving them. However, the travel direction of the travel portions 9 at a branching portion 7 may be controlled or selected by steering the travel wheels 15 without providing the guide auxiliary wheels.

(5) In the embodiment described above, an example is described in which the information obtaining portion 28 store in the memory 25, the position information, the connection information, the distance information, the speed information, and the roller information. However, the information obtaining portion 28 only needs to obtain at least the position information and so; the information obtaining portion 28 may be configured to not obtain the connection information, the distance information, the speed information, or the roller information. Alternatively, the information obtaining portion 28 may be configured to obtain only a portion of at least one of the connection information, the distance information, the speed information, and the roller information.

(6) In the embodiment described above, an example is described in which a vehicle is an article transport vehicle 3 configured to travel along a travel rail track 2 installed close to a ceiling. However, a vehicle may be a transport vehicle that travels along one or more rails installed on a floor surface. In addition, a vehicle may be one that travels for purposes other than to transport articles W.

(7) Note that an arrangement disclosed in any of the embodiments described above can also be used in combination with any arrangement disclosed in any other embodiment unless inconsistency arises. Regarding any other arrangements and features, the embodiments disclosed in the present description are provided for the purposes of illustration only regarding all aspects. Therefore, it is possible to make various suitable changes without departing from the spirit of the present disclosure.

3. Brief Summary of Embodiments Described Above

A brief summary of the description about the vehicle as described above is provided next.

A vehicle configured to support an imaging device and to travel along a rail track, the vehicle comprises: one or more travel portions each configured to travel along a rail track; a travel controller configured to perform an image recognition to determine a shape of a portion of the rail track based on an image captured by the imaging device and to control the one or more travel portions based on a result of the image recognition; an information obtaining portion configured to obtain position information of each of a plurality of locations that the one or more travel portions travel past as a result of traveling along the rail track, and to obtain the order in which the position information of the plurality of locations is obtained; and memory configured to store information obtained by the information obtaining portion.

With such an arrangement, since the travel controller can control the one or more travel portions by determining the shape of a portion of the rail track along which the one or more travel portions travels based on the image recognition result, the travel controller can cause the one or more travel portions to travel along the rail track even if the travel controller does not have a complete travel map information. And while traveling in this manner, the position information of each of a plurality of locations along the rail track, and the order in which the position information of the plurality of locations is obtained can be obtained by the information obtaining portion. And such obtained information can be stored in the memory. And by using the information about the order in which the position information stored in the memory is obtained, the work required to associate the position information with the basic map information can be simplified. Therefore, the work required to create travel map information in which the position information is associated with the basic map information can be simplified.

Here, the travel controller is preferably configured to: (a) determine, based on the result of the image recognition, (i) whether a branching portion is present in which a rail track branches off from another rail track, and (ii) a configuration of the branching portion if present, (b) select a travel direction to be taken such that a rail track that the one or more travel portions has not travelled along is preferentially selected if there is such a rail track that the one or more travel portions has not travelled along exists among a plurality of possible rail tracks that can be taken at the branching portion, and (c) control the one or more travel portions to cause the one or more travel portions to take the selected travel direction.

With such an arrangement, when traveling through a branching portion, the travel controller causes the one or more travel portions to travel along a rail track that the one or more travel portions have not travelled along is preferentially selected; therefore, the one or more travel portions can travel along each of the rail tracks in a branching portion by traveling through the branching portion the same number of times as the number of the rail tracks in the branching portion (twice for example if there are two rail tracks in a branching portion with one branching off from another, as in the embodiments). This arrangement allows the one or more travel portions to efficiently cover, or travel along each of, the installed rail tracks.

In addition, the information obtaining portion preferably includes a position information reader configured to read position information of a plurality of position displays that are spaced apart from one another along one or more rail tracks, wherein the information obtaining portion is preferably configured to obtain: (a) position information of each of the plurality of position displays that is read by the position information reader; and (b) connection information about how the plurality of position displays are connected by one or more rail tracks.

With such an arrangement, the position information of a plurality of position displays that are spaced apart from one another along one or more rail tracks can be read by the position information reader as the one or more travel portions travel along one or more rail tracks (i.e., along one rail track after another). In addition, by obtaining information about the order in which the position information of the plurality of position displays is obtained as well as the travel direction taken at a branching portion, the connection information which indicates how a plurality of position displays are connected to one another by one or more rail tracks can be properly obtained.

Also, the vehicle preferably further comprises map memory configured to store therein basic map information which is information about a shape of each rail track and how rail tracks are connected to one another, wherein the information obtaining portion is configured to store in the map memory the position information and the connection information that are obtained such that the position information and the connection information that are obtained are associated with the basic map information.

With such an arrangement, the information obtaining portion can automatically store in the map memory the position information and the connection information that are obtained such that the position information and the connection information that are obtained are associated with the basic map information. Thus, the work required to create the travel map information in which the position information and the connection information are associated with the basic map information can be further simplified.

In addition, each of the one or more travel portions preferably includes one or more guide rollers configured to guide the travel portion in the selected travel direction when traveling through a branching portion, and wherein the travel controller is preferably configured to move the one or more guide rollers to a position corresponding to the selected travel direction for a branching portion.

With such an arrangement, when the travel direction in a branching portion is selected, the one or more guide rollers are moved to the position that corresponds to the selected travel direction; so, each of the one or more travel portions travels in the selected travel direction while being guided by the one or more guide rollers. Thus, the one or more travel portions can travel properly in the selected travel direction.

Also, in addition to the position information and the connection information, the information obtaining portion is preferably configured to obtain at least one of: (a) distance information which indicates a distance between two adjacent detected members; (b) speed information which indicates a set travel speed for the one or more travel portions which is set for each of a plurality of position displays; and (c) roller information which indicates the position of the one or more guide rollers of each of the one or more travel portions at the time of traveling past each of a plurality of position displays.

With such an arrangement, the information obtaining portion can determine the distance between two adjacent position displays by obtaining the distance information. Thus, based on this obtained distance information, the position information can be properly stored such that the position information is associated with the basic map information. In addition, with respect to the speed information, for example, it is possible to obtain information about a proper travel speed appropriate for the shape (for example, curvature etc.) of a portion of a rail track based on an image recognition result. Thus, speed information, which indicates the set travel speed for the one or more travel portions that is appropriate for the shape of the portion of a rail track at a location that corresponds to each of a plurality of position displays, can be stored in the memory such that the speed information is associated with the basic map information. In addition, by obtaining the roller information, the position of the one or more guide rollers at the time the position information of a position display is obtained by the information obtaining portion can be obtained. Therefore, the information, which can be used to determine the travel direction taken in a branching portion, can be obtained. And by obtaining such various information, it becomes possible to improve the accuracy of travel map information when creating or completing the travel map information in which the position information is associated with the basic map information.

INDUSTRIAL APPLICABILITY

The technology in accordance with the present disclosure can be used in a vehicle configured to travel along a rail track.

What is claimed is:

1. A vehicle configured to support an imaging device and to travel along a rail track, the vehicle comprising:
   one or more travel portions each configured to travel along at least one rail track;
   a travel controller configured to perform an image recognition to determine a shape of a portion of the at least one rail track along a travel direction of the vehicle based on an image captured by the imaging device and to control the one or more travel portions based on a result of the image recognition;
   an information obtaining portion configured to obtain position information of each of a plurality of locations that the one or more travel portions travel past as a result of traveling along the at least one rail track, and to obtain information on an order in which the position information of the plurality of locations is obtained; and
   memory configured to store information obtained by the information obtaining portion,
   wherein the travel controller is configured to:
   (a) determine, based on the result of the image recognition, (i) whether a branching portion is present in which a rail track branches off from another rail track, and (ii) a configuration of the branching portion if present;
   (b) select a travel direction to be taken; and
   (c) control the one or more travel portions to cause the one or more travel portions to take the selected travel direction.

2. The vehicle as defined in claim 1, wherein the travel controller is configured to control a travel speed of the one or more travel portions in accordance with a curvature of the at least one rail track based on a result of the image recognition of the shape of a portion of the at least one rail track.

3. The vehicle as defined in claim 1, wherein the travel controller is configured to control the one or more travel portions such that a rail track that the one or more travel portions has not travelled along is preferentially selected if there is such a rail track that the one or more travel portions has not travelled along that exists among a plurality of possible rail tracks that can be taken at the branching portion.

4. The vehicle as defined in claim 3, wherein: the information obtaining portion includes a position information reader configured to read position information of a plurality of position displays that are spaced apart from one another along, in a case where the at least one rail track includes a plurality of rail tracks, the plurality of rail tracks, and
   wherein the information obtaining portion is configured to obtain:
   (a) position information of each of the plurality of position displays that is read by the position information reader; and
   (b) connection information about how the plurality of position displays are connected by the plurality of rail tracks.

5. The vehicle as defined in claim 4, further comprising map memory configured to store therein basic map information which is information about a shape of the at least one rail track and how the plurality of rail tracks are connected to one another,
   wherein the information obtaining portion is configured to store in the map memory the position information and the connection information that are obtained such that the position information and the connection information that are obtained are associated with the basic map information.

6. The vehicle as defined in claim 4, wherein each of the one or more travel portions includes one or more guide rollers configured to guide the travel portion in the selected travel direction when traveling through a branching portion, and
   wherein the travel controller is configured to move the one or more guide rollers to a position corresponding to the selected travel direction for a branching portion.

7. The vehicle as defined in claim 6, wherein in addition to the position information and the connection information, the information obtaining portion is configured to obtain at least one of:
   (a) distance information, which indicates a distance between two adjacent detected members;
   (b) speed information, which indicates a set travel speed for the one or more travel portions which is set for each of a plurality of position displays; and
   (c) roller information, which indicates the position of the one or more guide rollers of each of the one or more travel portions at the time of traveling past each of a plurality of position displays.

8. A vehicle configured to support an imaging device and to travel along a rail track, the vehicle comprising:
   one or more travel portions each configured to travel along at least one rail track;
   a travel controller configured to perform an image recognition to determine a shape of a portion of the at least one rail track along a travel direction of the vehicle based on an image captured by the imaging device and to control the one or more travel portions based on a result of the image recognition;

an information obtaining portion configured to obtain position information of each of a plurality of locations that the one or more travel portions travel past as a result of traveling along the at least one rail track, and to obtain information on an order in which the position information of the plurality of locations is obtained;

memory configured to store information obtained by the information obtaining portion, and map memory configured to store therein basic map information which is information about a shape of the at least one rail track and, in a case where the at least one rail track includes a plurality of rail tracks, how the plurality of rail tracks are connected to one another, wherein the information obtaining portion includes a position information reader configured to read position information of a plurality of position displays that are spaced apart from one another along the plurality of rail tracks, wherein the information obtaining portion is configured to obtain:

(a) position information of each of the plurality of position displays that is read by the position information reader; and (b) connection information about how the plurality of position displays are connected by the plurality of rail tracks, and wherein the information obtaining portion is configured to store in the map memory the position information and the connection information that are obtained such that the position information and the connection information that are obtained are associated with the basic map information.

* * * * *